United States Patent
Lay

(10) Patent No.: US 6,930,937 B2
(45) Date of Patent: Aug. 16, 2005

(54) SECTOR SYNCHRONIZED TEST METHOD AND CIRCUIT FOR MEMORY

(75) Inventor: Shyan-Jer Lay, Hsinchu (TW)

(73) Assignee: Macronix International Co. Ltd., Hsinchu (TW)

( * ) Notice: Subject to any disclaimer, the term of this patent is extended or adjusted under 35 U.S.C. 154(b) by 0 days.

(21) Appl. No.: 10/115,779

(22) Filed: Apr. 3, 2002

(65) Prior Publication Data

US 2003/0043662 A1 Mar. 6, 2003

(30) Foreign Application Priority Data

Aug. 30, 2001 (TW) .................................... 90121413 A

(51) Int. Cl.$^7$ ............................................... G11C 7/00
(52) U.S. Cl. .................. 365/201; 365/189.04; 324/765
(58) Field of Search ........................... 365/201, 189.04; 324/765

(56) References Cited

U.S. PATENT DOCUMENTS 5,736,850 A * 4/1998 Legal ...................... 324/158.1
5,838,163 A * 11/1998 Rostoker et al. ............ 324/763
5,861,660 A * 1/1999 McClure ..................... 257/620
2002/0021140 A1 * 2/2002 Whetsel ...................... 324/765
2002/0070748 A1 * 6/2002 Ernst et al. .................. 324/765

FOREIGN PATENT DOCUMENTS

JP 2001-176299 6/2001

* cited by examiner

Primary Examiner—Van Thu Nguyen
Assistant Examiner—Toan Le
(74) Attorney, Agent, or Firm—J.C. Patents

(57) ABSTRACT

A sector synchronized test method and circuit for a memory, applicable for testing several electrically programmable or electrically erasable memory dies. The section synchronize test circuit has a read-write device, a selected switch, and a plurality of test interfaces. While programming or erasing the memory dies simultaneously, the selected switch connects the parallel output terminal, so that the memory dies are connected in parallel. Meanwhile, the read-write device receives a test signal to perform the program or erase operation on the memory dies according to the test signal.

8 Claims, 3 Drawing Sheets

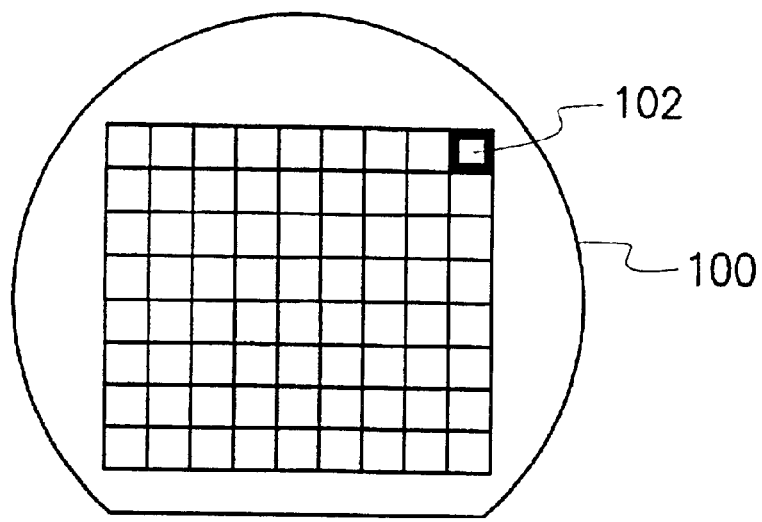
FIG. 1 (PRIOR ART)
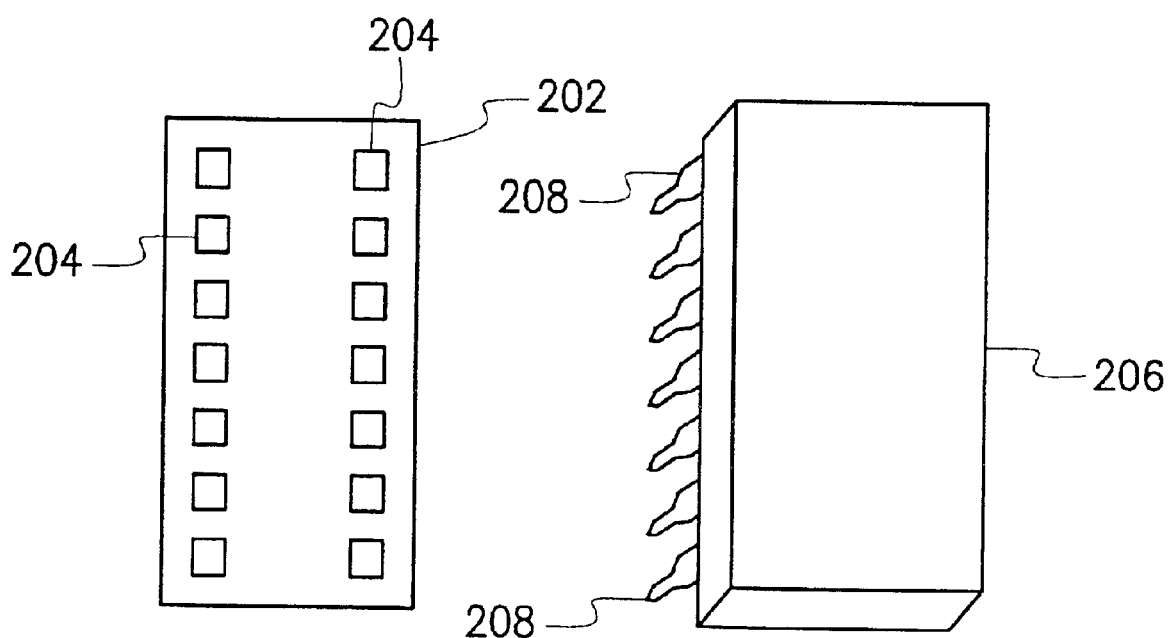
FIG. 2A
(PRIOR ART)
FIG. 2B
(PRIOR ART)

SECTOR SYNCHRONIZED TEST METHOD AND CIRCUIT FOR MEMORY

CROSS-REFERENCE TO RELATED APPLICATION

This application claims the priority benefit of Taiwan application serial no. 90121413, filed Aug. 30, 2001.

BACKGROUND OF THE INVENTION

1. Field of the Invention

The invention relates in general to a test method and a test circuit for a memory, and more particularly, to a sector synchronized test method and circuit for a memory.

2. Description of the Related Art

FIG. 1 shows a schematic drawing of a wafer. As the semiconductor technique is more and more advanced, each die 102 of a wafer 100 comprises more and more transistor circuits. For example, the capacity of a memory becomes increasingly large. For a memory die such as erasable programmable or electrically erasable programmable memory die, the power consumption has to be reduced.

With regard to the erasable programmable or electrically erasable programmable memory, the yield test of the wafer has to be performed after completing the fabrication of integrated circuits. To perform the yield test on the wafer, or the IC test when the die is packaged as an IC, a DC test, a program and erase operation on the memory and a step of reading the data stored in the memory after the program and erase operation are required. From this, whether the die or the IC operates normally can be determined. Expressed as a mathematical formula as $A*PT+B*PT-C*PT$, A denotes the DC test time, B denotes the program and erase time, C denotes the read time, and PT means the probing times.

FIG. 2A shows a die, while FIG. 2B shows an IC. In the DC test, a direct current is input from the pad 204 of the die 202 or from the pin 208 of the IC 206 to test the open circuit status and short circuit status of the integrated circuit. A tester is used to input a test signal into the die 202 or the IC 206. The test signal determines the test mode, such as the program or the erase operation of the memory of the die 202 or the IC 206. After performing the program operation on the memory, the tester reads the data stored in the memory. After performing the erase operation on the memory, the tester reads the data stored in the memory again to confirm whether the program and erase operations performed on the die or IC are normal.

While performing the above test, the number of channels provided by the tester determines the quantity of dies or IC to be tested. If the number of dies or IC's of the wafer is large, many repetitions of program and erase operations are required with the fixed number of channels. Thus, the program and erase operations of the memory dominate the test time, which is proportional to the capacity of the memory. The early-developed memory has a capacity less than the current memory and takes about 20–30% of the test time for program and erase operations. The current memory has a much increased capacity, plus the requirement of low power consumption of IC. The program and erase operation time is increased to about 50% of the test time. With the fixed number of dies or IC's, the time required for DC test and reading the data stored in the memory is constant. Thus, the more the capacity of the memory is, the longer time the program and erase operations take.

SUMMARY OF THE INVENTION

The invention provides a sector synchronized test method and circuit. By providing more test channels for the circuit, program and erase operation is performed on more dies or IC's at a time. Therefore, the time required for performing program and erase operations on the memory is shortened, and the whole test time of the wafer or IC is decreased.

The invention provides a sector synchronized test method of a memory to test a plurality of electrically programmable or electrically erasable memory dies. A test signal is input. According to the test signal, the program operation or the erasable operation is performed on the memory dies.

The invention further provides a sector synchronized test circuit of a memory to test a plurality of electrically programmable or electrically erasable memory dies. The sector synchronized test circuit comprises a read-write device and a selected switch. The read-write device receives a test signal. According to the test signal, a program operation or an erase operation is performed on the memory dies simultaneously. The selected switch comprises an input terminal, a parallel output terminal and a plurality of output terminals. The input terminal is coupled to the read-write device. The parallel output terminal is coupled to the memory dies. Each of the output terminals is coupled to one of the memory dies. When performing the program or the erase operation, the selected switch connects the parallel output terminal to perform the program or erase operation on the memory dies simultaneously.

Both the foregoing general description and the following detailed description are exemplary and explanatory only and are not restrictive of the invention, as claimed.

BRIEF DESCRIPTION OF THE DRAWINGS

FIG. 1 shows a conventional wafer;

FIG. 2A shows a die;

FIG. 2B shows a conventional IC;

DESCRIPTION OF THE PREFERRED EMBODIMENTS

Figure 3:
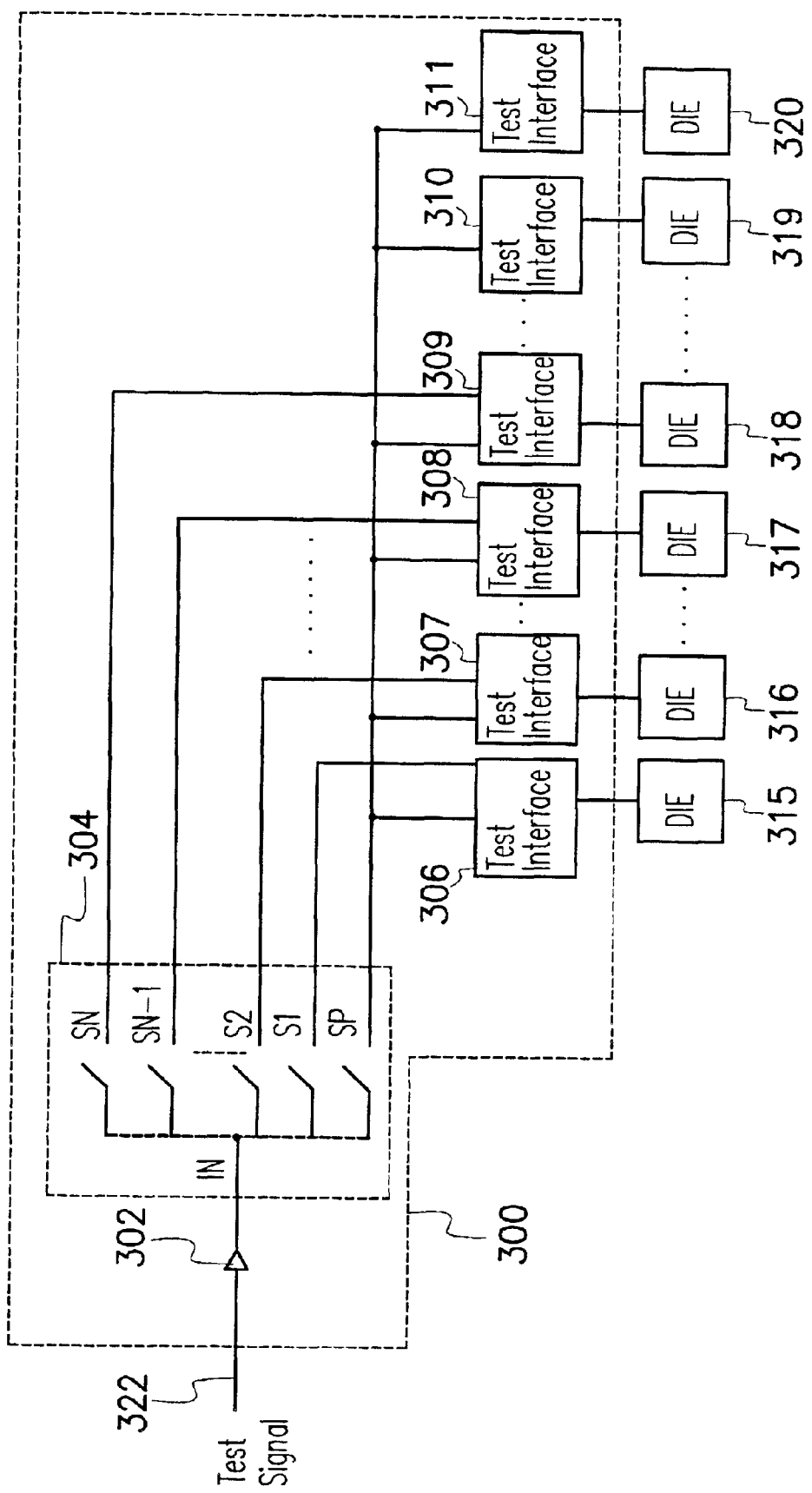
FIG. 3 shows the sector synchronized test circuit for a memory provided by the invention.

FIG. 3 shows the sector synchronized test circuit for a memory provided by the invention. While performing a DC test on a memory die 315 to 320, the direct test power source or signal bus 322 (data transfer in both directions) is sent from the read-write device 302 to the input terminal IN of the selected switch 304. According to the channel connected by the selected switch 304 on one of the memory die 315 to 320, the DC test is performed on one of the memory dies. For example, when the output terminal S1 is connected with the selected switch 304, the direct test power source or signal bus and test interface 306 will perform a DC test on memory die 315. Similarly, when the output terminals S2, . . . , SN-1, SN of the selected switch 304 are connected, the direct test power source or signal bus and test interface 307, . . . , 308, 309 will perform a DC test on memory die 316, . . . , memory die 317, and memory die 318. When the memory dies, which are waiting to be tested are in the unpackaged state or in the before-cut wafer state, the direct test power source or signal bus do not require test interface 307 to 309 to perform test.

The input terminal In of the selected switch 304 of the sector synchronized test circuit 300 for the memory is coupled to input of the read-write device 302. The parallel output terminal SP of the selected switch 304 is connected to M test interfaces (test interface 306 to 311 shown in FIG.

3), the selected switch 304 also comprises N output terminals (S1, S1, ..., SN-1, and SN) each connected to the N test interfaces (test interface 306 to 309 shown in FIG. 3). For example, if the output terminal S1 of the selective switch 304 is coupled to the test input terminal of test interface 306, the test output terminal of test interface 306 is coupled to the memory die 315. If the output terminal S2 is coupled to test input terminal of test interface 307, the test output terminal of test interface 307 is coupled to the memory die 316. If the output terminal SN-1 of the selective switch 304 is coupled to the test input terminal test interface 308, the test output terminal of test interface 308 is coupled to the memory die 317. If the output terminal SN of the selective switch 304 is coupled to the test input terminal test interface 309, the test output terminal of test interface 309 is coupled to the memory die 318. When M memory dies (memory die 315 to 320 shown in FIG. 3) (where M≧N) need to be programmed or erased at the same time, the selective switch 304 will connect the parallel output terminal SP causing M memory dies 315 to 320 to be programmed or erased at the same time. As a result, the time required for programming or erasing operations on the memory dies in the wafer (not shown) is greatly reduced and the overall test time is shortened.

After performing program or erase operation on the memory dies, the channel conducted by the selected switch 304 reads the data stored in one of the memory dies. For example, when the channel of the output terminal S1 of the selected switch 304 is connected, the signal bus 322 of a tester (not shown) reads the data stored in the memory die 315 via the read-write device 302 (test data in the memory die 315 is transmitted from the test interface 306 to the output terminal S1 of the selective switch 304). Similarly, when the channels of the output terminals S2, ..., SN-1, SN of the selected switch 304 are individually connected, the tester (not shown) simultaneously or separately reads the data stored in the memory dies 307, ..., memory die 308, and memory die 309 from the read-write device 302 via signal bus 322.

Figure 4A:
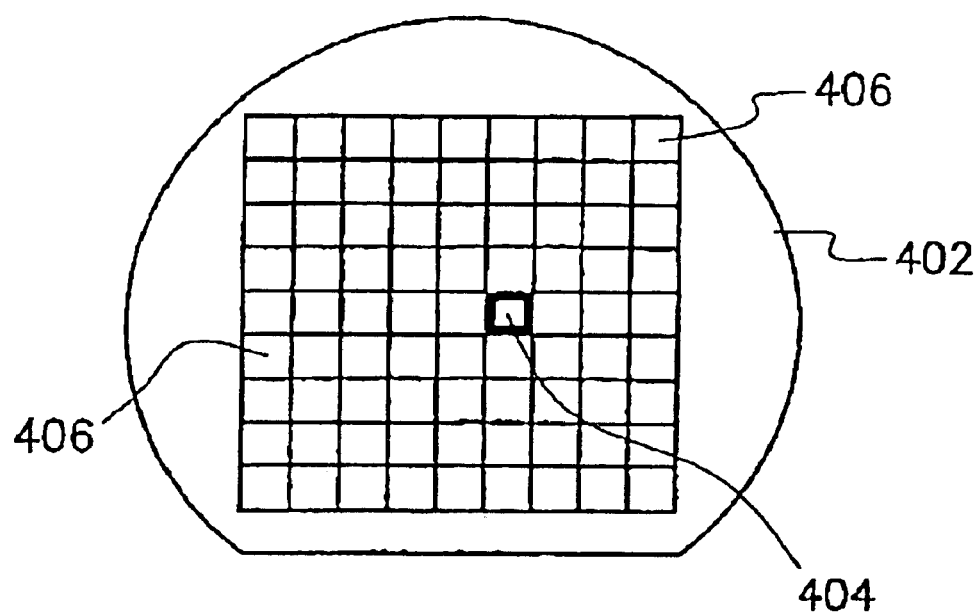
FIG. 4A shows a wafer with a built-in self test circuit.

The application of the sector synchronized test circuit is very broad. For example, FIG. 4A shows a wafer with a built-in self test circuit. In FIG. 4A, a die 404 can be arbitrarily selected from the wafer 402 for the built-in self test circuit. The built-in self test circuit comprises a sector synchronized test circuit of the memory (as shown in FIG. 3). The output terminal of the selected switch 302 (shown in FIG. 3) of the sector synchronized test circuit can be connected to test interface 315 to 311 (shown in FIG. 3) and further to the test pad of each die 406 to achieve the objective of the device as illustrated in FIG. 3.

Figure 4B:
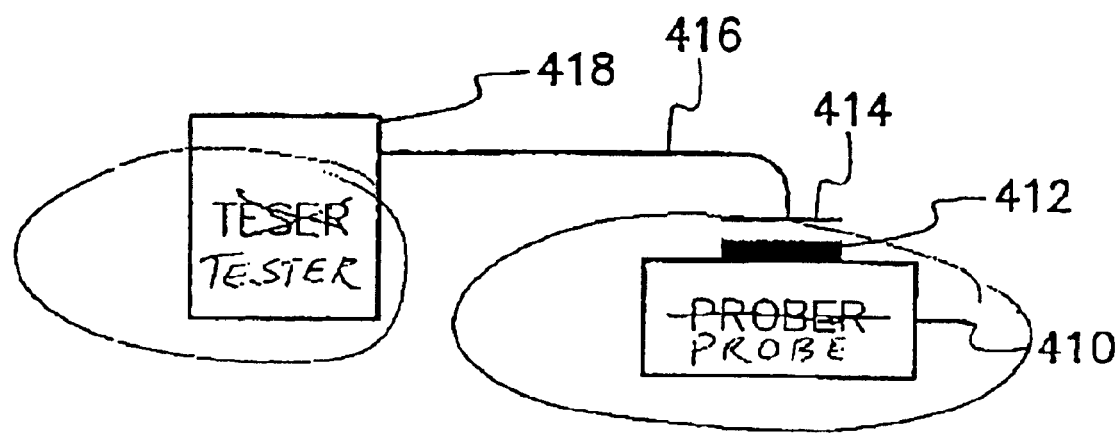
FIG. 4B shows a machine for testing the memory.

Another application of the sector synchronized test circuit for a memory is illustrated as FIG. 4B. In FIG. 4B, a wafer or IC 412 to be tested is disposed on a probe 410. An interface hardware circuit 414 is connected to a tester 418 via a cable 416. The interface hardware circuit 414 receives a test signal and a power source output from the tester 418 via the cable 416 to test the wafer or IC 412 to be tested. The interface hardware circuit 414 for testing the wafer includes a probe card, while the interface hardware circuit 414 for testing the IC includes a Hi-Fix. The sector synchronized test circuit for a memory (as shown in FIG. 3) can be built in the interface hardware circuit 414 or the tester 418. Thus, the probe of the probe card can be used to test the wafer. Or alternatively, the wire of the Hi-Fix is used to test the IC to achieve the objective of FIG. 3.

The mathematical formula "A*PT+B+C*PT" used in the invention is compared to the conventional formula mentioned above, in which the time consumed by program or erase operation is determined by the number of the probes and dies. The invention performs the program or erase operation on all the dies of the wafer simultaneously.

The invention comprises the advantage of building up the sector synchronized test circuit in the built-in self test circuit, the interface hardware circuit or the tester. As a result, more test channels are provided by the circuit, and the program or erase operation is performed on more dies or IC's at the same time. Thus, the time required for program and erase operations is greatly reduced. The overall test time for the wafer or IC is significantly shortened.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A sector synchronized test method for a memory, applicable to a plurality of electrically programmable or electrically erasable memory dies, the test method comprising:

inputting a test signal; and receiving the test signal and sending the test signal to memories dies via a selective switch and test object, wherein a read-write device is adapted for receiving and sending the test signal; and performing either a program operation or an erase operation on the memory dies according to the test signal, wherein the selective switch connects channel of parallel output terminal of the selective switch to perform either the program or erase operation on the memory dies.

2. The test method in claim 1, wherein the electrically programmable or electrically erasable memory dies further comprise a DC testing and a reading function.

3. A sector synchronized test circuit for a memory, applied to a plurality of electrically programmable or electrically erasable memory dies, the test circuit comprising:

a read-write device, to receive a test signal and to perform either a program operation or an erase operation on the memory dies according to the test signal;

a selective switch, comprising an input terminal, a parallel output terminal and a plurality of output terminals, wherein the input terminal is coupled to the read-write device;

a plurality of test interfaces, comprising a test input terminal and a test output terminal, wherein the test input terminal is coupled to one of the output terminal of the parallel output terminal of the selective switch and the output terminal is further coupled to one of the memory dies; and wherein, after the read-write device receives the test signal, the read-write device will send the test signal to the memory dies via the selective switch and the test interfaces, when either the program or erase operation is performed, the selective switch will connect the channel of the parallel output terminal to perform either the program and erase operation on the memory dies.

4. The test circuit according to claim 3, wherein the sector synchronized test circuit for the memory is formed in a built-in self test circuit of a wafer.

5. The test circuit according to claim 3, wherein the sector synchronized test circuit for the memory is formed in an interface hardware circuit, and the interface hardware circuit is formed between a tester and a probe.

6. The test circuit according to claim 3, wherein the sector synchronized test circuit for the memory is formed in a tester.

7. The test circuit according to claim 3, wherein the sector synchronized test circuit for the memory further comprises a DC testing and a reading function.

8. A sector synchronized test method for a memory, applicable to a plurality of electrically programmable or electrically erasable memory dies, the test method comprising:

inputting a test signal; and performing either a program operation or an erase operation on the memory dies simultaneously according to the test signal, wherein the electrically programmable or electrically erasable memory dies further comprise a DC testing and a reading function.

* * * * *